United States Patent [19]

Negas et al.

[11] Patent Number: 4,942,146

[45] Date of Patent: Jul. 17, 1990

[54] DENSE CERAMIC ALLOYS AND PROCESS OF MAKING SAME

[75] Inventors: Taki Negas; Louis P. Domingues, both of Adamstown, Md.

[73] Assignee: Alpha Industries, Woburn, Mass.

[21] Appl. No.: 49,984

[22] Filed: May 15, 1987

[51] Int. Cl.$^5$ .............................................. C04B 35/46
[52] U.S. Cl. ................................... 501/134; 501/120; 501/135; 501/136
[58] Field of Search ................ 501/134, 135, 136, 120

[56] References Cited

U.S. PATENT DOCUMENTS

| | | | |
|---|---|---|---|
| 2,165,819 | 7/1939 | Albers-Schouberg | 501/136 |
| 2,305,327 | 12/1942 | Thurnauer | 501/136 |
| 2,328,410 | 8/1943 | Berge | 501/136 |
| 2,665,219 | 1/1954 | Thurnauer et al. | 501/136 |
| 2,691,088 | 10/1954 | Ungewiss | 501/136 |
| 2,741,561 | 4/1956 | Das Gupta | 501/136 |
| 3,990,902 | 11/1976 | Nishizawa et al. | 501/134 |
| 4,071,881 | 1/1978 | Bacher | 501/136 |
| 4,173,485 | 11/1979 | Woditsch et al. | 501/136 |
| 4,304,603 | 12/1981 | Grossman et al. | 501/136 |
| 4,307,198 | 12/1981 | Oda et al. | 501/136 |
| 4,308,570 | 12/1981 | Burn | 501/136 |
| 4,668,644 | 5/1987 | Filhol | 501/136 |

*Primary Examiner*—Mark L. Bell
*Assistant Examiner*—Anthony J. Green
*Attorney, Agent, or Firm*—Armstrong, Nikaido, Marmelstein, Kubovcik & Murray

[57] ABSTRACT

A method of fine-tuning the dielectric constant value of an insulating ceramic alloy, and the resulting alloy, and uses thereof, are disclosed. The alloy has the general formula:

$$Mg_xAl_yTi_zO_4$$

wherein $$x+y+z=3$$

$$x=1-2$$

$$y=0.1-1.9$$

$$z=0.1-0.9$$

and is preferably made from 10 to 90 mol percent of magnesium titanate and 90 to 10 mol percent of magnesium aluminate. The mole ratio of the titanate to the aluminate in the alloy is varied in order to vary the value of the dielectric constant of the alloy. The alloy has a density which is at least 98% of the theoretical density of the alloy, and a dielectric constant of 8.5 to 13.8.

The alloy can be used in applications wherein dielectric materials have previously been utilized, such as a substrate for an electrical circuit.

14 Claims, 1 Drawing Sheet

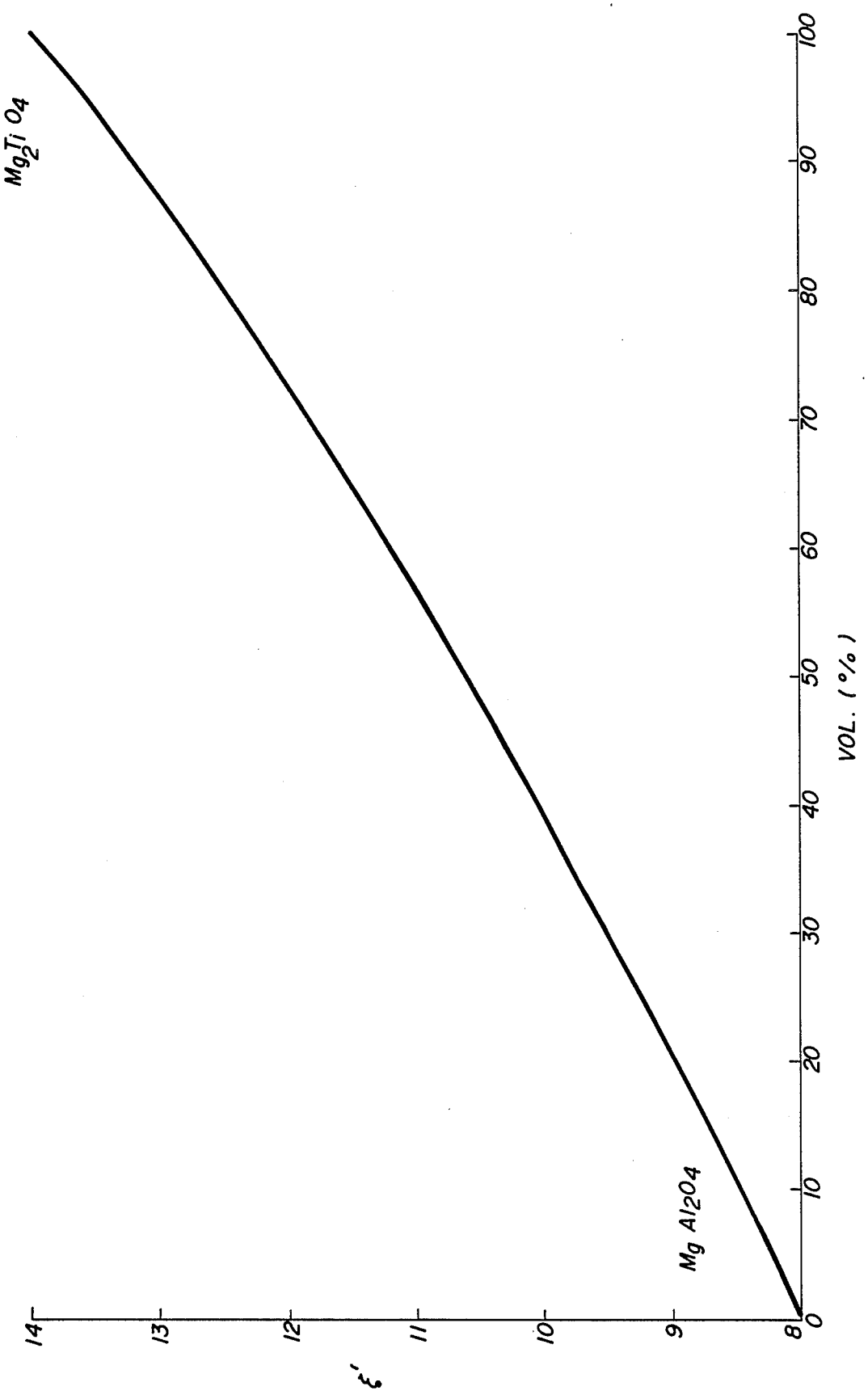

DENSE CERAMIC ALLOYS AND PROCESS OF MAKING SAME

FIELD OF THE INVENTION

The present invention relates to insulating ceramic alloys and methods for making the same.

BACKGROUND OF THE INVENTION

Ceramic dielectric materials have been known for an extended period of time, and have been widely used as electrical insulators in various electrical devices. A typical, widely used insulator is alumina, which generally has a dielectric constant of 9 to 9.9. Alumina has a high firing temperature, in the order of 1550° C., and is difficult to machine due to a hardness of approximately 9. Oxides of titanium have been added to alumina to soften the alumina, with the resulting material becoming a composite, which leads to other problems.

Oda et al U.S. Pat. No. 4,307,198 discloses low-expansion ceramics having a chemical composition of 2-20 wt. % of magnesia (MgO), 10-68 wt. % of alumina ($Al_2O_3$) and 30-80 wt. % of titania ($TiO_2$), wherein the major component of the crystalline phase is magnesium-aluminum-titanate phase. These ceramics are made by mixing magnesia, magnesium carbonate and/or magnesium hydroxide; alumina and/or aluminum hydroxide; and anatase-and/or rutile-type titanium dioxide; adding a plasticizer, if necessary to form a shapeable mass; shaping the mass by extrusion, pressing, slip casting or injection molding; drying the shaped body; and firing at 1300° to 1700° C. These low-expansion ceramics are taught to be useful in fields where heat-resistance, thermal shock-resistance, wear-resistance, and corrosion-resistance are required. More particularly, the ceramics are taught to be useful as substrates for automobile exhaust gas purification catalysts; filters for diesel exhaust particulates; industrial or automotive ceramic heat exchangers; engine parts such as pistons, cylinder liners, combustion chambers, auxiliary combustion chambers, turbo-charger rotors or the like; gas turbine parts such as nozzles, rotors, shrouds, scrolls, plenum, burner tail cylinders or the like; heat resistant ceramic materials for receivers of solar energy; refractory materials; and chinawares and porcelains for the chemical industries. There is no disclosure as to the electrical insulating properties of these ceramics.

Albers-Schonberg U.S. Pat. No. 2,165,819 discloses the use of magnesium titanate as an electrical insulator. Berge U.S. Pat. No. 2,328,410, Ungewiss U.S. Pat. No. 2,691,088 and Thurnauer U.S. Pat. No. 2,665,219 all disclose magnesium titanate ceramic insulators.

Woditsch U.S. Pat. No. 4,173,485 discloses the preparation of zinc and/or alkaline earth titanates, which may be doped with aluminum, phosphorous, boron and/or silicon, for use as white pigments in lacquers, plastics and paper, and as ferro-electrics. In particular, as shown in Example 2, a pigment of magnesium titanate doped with aluminum may be formed in accordance with the disclosed process.

Das Gupta U.S. Pat. No. 2,741,561 discloses a composition, having little if any variance of dielectric constant with change in temperature, based upon $Ca_2TiO_3$, $Mg_2TiO_4$, plus $ZrO_2$ and clay additions.

"Phase Diagrams for Ceramists", 1964 supplement, Levin and McMurdie, published by the American Ceramic Society Inc., 1964, at page 247 presents a phase diagram for the system MgO—$Al_2OTi$—$O_2$, with the indication that between $MgAl_2O_4$ and $Mg_2TiO_4$ solid solutions are obtained.

SUMMARY OF THE INVENTION

The present invention is directed to an insulating ceramic alloy of the formula:

$$Mg_xAl_yTi_zO_4$$

wherein $$x+y+z=3$$

$$x=1-2$$

$$y=0.1-1.9$$

$$z=0.1-0.9$$

with the alloy having a density of at least 98% of the theoretical density of the alloy.

The alloy has a dielectric constant which is in the range of 8.5-13.8 and a particular dielectric constant value within that range can be adjusted by changing the ratios of the starting components of the alloy. The alloy has a consistant, low dielectric loss, generally on the order of less than 0.0001 tan Δ (or, expressed otherwise, of greater than a quality factor Q of 10,000), measured at 10 GHz. The present invention permits the dielectric constant values of the alloy to be fine tuned, and the temperature coefficients of the dielectric constant ($T_k$ ($^0C^{-1}$)) are rather flat, with little variation, and generally near +100 ppm. The alloy is readily machineable and the final dielectric material made from the alloy can be produced with lower firing temperatures than alumina or other dielectrics. The alloy exhibits less corrosion sensitivity than previous dielectrics, can be manufactured to a controlled density, and is relatively cheap to produce.

DETAILS OF THE INVENTION

The alloy of the present invention may be produced by alloying magnesium aluminate ($MgAl_2O_4$) and magnesium titanate ($Mg_2TiO_4$).

The relative proportions of the magnesium aluminate and the magnesium titanate can be readily determined from examination of the accompanying FIGURE, which indicates the volume percentage of magnesium titanate required in the alloy for a given dielectric constant value between 8 and 14. As will be readily noted from the FIGURE, for instance, a magnesium titanate volume percentage of 30 produces an alloy having a dielectric constant of 9.5, a proportion of 50 volume percent of magnesium titanate produces a dielectric constant value of the alloy of 10.6, 60% magnesium titanate in the alloy produces a dielectric constant of 11.2, and 80% of magnesium titanate produces a dielectric constant of 12.5.

The ceramic products of the present invention can be produced by simply mixing magnesium aluminate and magnesium titanate, in finely divided form, in the proportions indicated in FIG. 1 to produce the desired dielectric constant value. The mixture is then presintered at 1050° to 1250° C., preferably about 1200° C., to initiate reactions among the raw materials, and then milled to reduce particle size to an average particle size of 1 to 5 microns, preferably 1 to 2 microns, and then the milled product is shaped into the desired form by conventional means, such as extrusion, pressing, slip casting, injection molding or the like, and dried and fired to form a single phase alloy. Typically the firing temperatures are in the range of 1325° to 1450° C., and preferably 1400° to 1450° C.

As will be clear to those of ordinary skill in this art, the alloys can be produced by alternative methods. For instance, suitable proportions of magnesia, magnesium carbonate and/or magnesium hydroxide, alumina and/or aluminum hydroxide and an oxide of titania, such as titanium dioxide can be mixed together and then fired at a temperature of 1325° to 1450° C.

The alloys of the present invention have a fired density which is more than 3.49 g/cm$^3$, and generally within the range of 3.50 to 3.55 g/cm$^3$.

During the firing, it is critical that the material being fired be maintained under pressure in order to produce the dense product of the present invention. It is possible to fire the alloy in an oxygen atmosphere in a hot isostatic press which exerts physical pressure on the material being fired, thereby reducing the porosity of the material such that the density of the resulting alloy is at least 98%, and preferably at least 99%, of the theoretical densities. Pressure applied in such an isostatic press will normally be in the range of 10 to 150 atmospheres.

Alternatively, and preferably, the shaped mixture to be fired is fired in an oxygen atmosphere under a positive gas pressure, with the gas gauge pressure being in the range of 0.7 to 5, and preferably 1 to 2, atmospheres. It is important to utilize an oxygen atmosphere in the firing step in order to insure that the titania is not reduced during the firing step.

The drying is conducted after mixing and after milling, and can be conducted at any temperature between room temperature and the firing temperature, and even lower temperatures than room temperature can be used if the shaped mixture is placed under vacuum.

The alloys of the present invention are pure, dense, single phase ceramic dielectric materials suitable for use in microwave applications. The alloy exhibits a very uniform fine grain microstructure due to the single phase nature of the alloy and is suitable for use whenever a very low loss and stable dielectric material is required.

The fine grain microstructure of the alloy allows surface finishes of well below 4 microinches using inexpensive conventional techniques, such as lapping and polishing. Parallelism having a variance of less than 0.0005 inches, and flatness having a variance of less than 0.0003 inches, are obtainable.

A typical alloy of the present invention, having a dielectric constant of 9.8, exhibits the following properties:

| | |
|---|---|
| Water Absorption-% | Nil |
| Density | >3.46 |
| Color | Cream |
| Thermal Conductivity-Cal./cm$^2$/cm/sec./°C. | 0.025 |
| Hardness-Mohs'-Scale | 7 |
| Tensile Strength-psi | 18,000 |
| Compressive Strength-psi | 250,000 |
| Flexural Strength-psi | 25,000 |
| Coefficient of Thermal Expansion per °C. (20° C. to 300° C.) | 7.5 × 10$^{-6}$ |
| Dielectric Strength-Volts per Mil | 300 |
| Dielectric Constant at 7 GHz- ′ | 9.8 ± 2.0% |
| Dielectric Loss Tangent at 10 GHz- ″/′ | 0.0001 |
| Temperature Coef. of Dielectric Constant/°C. | +100 × 10$^{-6}$ |

The properties of the alloys of the present invention render them particularly suitable for use as a substrate for electrical circuits. In such a use, the fired alloy will be ground/polished to a surface profile of less than 4 microinches. The dielectric constant value of the alloy can vary widely, depending upon the properties required by the user, but normally for electrical substrate applications the alloy will have a dielectric constant within the range of 9.5 to 13.0.

After the alloy has been ground/polished to the desired surface profile, an electrical circuit is applied thereon, using completely conventional techniques, such as by thin film techniques. The substrate is preferably ground/polished to a surface profile of 1 to 3 microinches. The preferred dielectric constant range of the alloy is 8.5 to 13, and the range of 9.2 to 10.4 is more preferrred. At the present time the most preferred that of alumina.

Appropriate electrical devices which would utilize the ceramic alloy of the present invention as a substrate for an electrical circuit include circulators, capacitors, filters, phase shifters for microwave and millimeter wave systems, multilayer digital circuitry, Faraday rotators and the like.

Since the ceramic alloy of the present invention is used as an electrical insulator, it can be of any desired thickness or shape. Normally the alloy of the present invention will be used in thin rectangular form, with the size of the rectangle being dictated by the size of the electrical circuit itself. The alloy wafer will generally be at least 0.005 inches in thickness, and preferably from 0.010 to 0.025 inches in thickness. It will be readily recognized that there is no real upper limit as to the thickness of the material that can be used as an electrical substrate, but for practical reasons the thickness will almost never be greater than 0.050 inches.

In another embodiment of the present invention the alloy of the present invention can be used in an array of stacks of printed circuits. The array would include a plurality of printed circuits which are separated from each other by thin layers of the alloy of the present invention. It is anticipated that the alloy in this use would have a dielectric constant value of 8.1 to about 9.5. It is likely that the mixture which will form the alloy will be tape-cast using convention tape casting techniques, to form prefired dielectric materials, which are placed in the desired array, with the printed circuits thereinbetween, prior to the firing step. Considerable effort has been exerted in the past by others in an attempt to use alumina dielectrics in such an desired array, with the printed circuits thereinbetween, prior to the firing step. Considerable effort has been exerted in the past by others in an attempt to use alumina dielectrics in such an array, and the higher firing temperature of alumina has resulted in substantial problems, so that the art has been definitely trying to develop an acceptable dielectric material having reduced firing temperatures. The alloy of the present invention seems particularly suited for such use.

In such an array, at least two printed circuits will be utilized, with a thin layer of the alloy of the present invention thereinbetween. Depending upon the particular end use for the array, there is no real upper limit as to the number of printed circuits that can be utilized in a stacked array, although normally the array will consist of 5 to 30 printed circuits in overlying stacked relationship, with each pair of adjoining printed circuits being separated from each other by a thin layer of the alloy of the present invention. In this application, the alloy will normally have a thickness of about 0.007 to 0.025 inches, and the two sides of the thin alloy layer will be as parallel as possible.

For this array of stacked multi-layer printed circuits, the lowest dielectric constant value of the dielectric ceramic is desired. Magnesium aluminate has a dielectric constant of only 8 but fires at too high a temperature. It is possible to go up in dielectric constant values slightly, which would be normally considered undesirable, to a value of about 9, but by so doing it is possible to reduce the firing temperature of the alloy by perhaps 200° C., which is a very decided advantage. Typically tape cast dielectric alloy material will be ten to twenty thousandths of an inch thick.

From the above description of suitable uses for the alloy of the present invention, it will be realized that the alloy of this invention can be used to electrically insulate two spaced points by interposing the alloy between the spaced points, with the alloy having a thickness of at least 0.005 inches between the spaced points.

In addition to permitting the specific dielectric constant value to be fine-tuned into the product, the present invention results in production of products which are somewhat less temperature dependent than existing dielectric commercial products. Furthermore, the coefficient of thermal expansion of the alloy of the present invention is generally lower than for similar competitive commercial products but higher than alumina. The alloy composition can be fired at firing temperatures in the order of 1400° C., which is substantially lower than that of existing alumina dielectric products having comparable dielectric constant values. The alloy of the present invention machines very well, as opposed to the extremely hard alumina competitive dielectric product.

The alloy of the present invention may be modified by minor additions of other conventional additives, such as, for example, calcium oxide which increases the toughness of the resulting alloy thereby resisting any tendency of crystals to fall out of the fired product.

Similar dielectric materials, having lower densities, produced by firing, e.g. under atmospheric pressure conditions, are disclosed in a copending application filed on even date herewith by Taki Negas and Louis Domingus, entitled "Ceramic Dielectric Alloy", the disclosure of which is hereby incorporated by reference.

EXAMPLES OF THE INVENTION

The present invention will be more clearly understood from the following examples, wherein pcercents and parts are by weight unless otherwise indicated.

EXAMPLE 1

This example relates to a process for producing a dielectric ceramic material having a dielectric constant of 12.2.

13.5369 kg of magnesium oxide (Maglite K of Merckoin and Co., 94.5% pure), 11.4528 kg of titanium dioxide (N.L.I. 3030, 99.5% pure) and 5.0103 kg of aluminum oxide (Alcoa A16, 99.5% pure) were added to 30 liters of distilled water in a mixing tank, with a Cowles dispenser operating at 800 rpm until all materials had been added. The mixed materials were then mixed for one hour at 1300 rpm, and the resulting slurry was dried overnight at 550° F. in pans. The dried material was passed through a 10 mesh sieve, and the material passing through the sieve was presintered at 1200° C. for 8 hours in air. The presintered material was added to 30 liters of distilled water in a porcelain ball mill loaded to one-half volume with one-half inch high density alumina cylinders, and milled for six hours. The milled slurry was dried overnight at 550° F. in pans.

A binder solution was prepared from 0.50 weight percent of polyvinyl alcohol (Dupont 75-15), 0.05 weight percent of Methocel (Dow Chemical K15MDGS) and 0.50 weight percent of polyethylene glycol (Union Carbide 3350), with all weights being based upon the weight of the dried powder. The binder solution was passed through a 100 mesh stainless steel sieve. An amount of distilled water equal to the weight of the dried powder was placed in a mixing tank having a Cowles dispenser, the powder was then added to the mixing tank in small quantities, and thereafter the binder solution was added to the mixing tank slurry. The material in the mixing tank was mixed for one hour at 1300 rpm, and the resulting slurry was passed through a 200 mesh sieve and then spray dried under the following conditions:

inlet temperature: 350° C.

outlet temperature: 125° C.

air pressure: 26 psi pump pressure: 20 psi

The resulting powder had a bulk density of 0.85 g/cm$^3$, with about 65% of the spray dried powder having a particle size between 140 and 270 mesh. The spray dried powder was pressed into the desired shapes at 6,000 psi and then fired in an oxygen atmosphere at a pressure of 12 psig and a temperature of 1430° C. for eight hours. The resulting material had a fired density of 3.55 g/cm$^3$, a dielectric constant of 12.3±0.2, and a dielectric loss tangent of 0.0001.

EXAMPLE 2

This example relates to a process for producing a dielectric ceramic material having a dielectric constant of 9.9.

55.1921 weight percent of aluminum oxide, 32.8712 weight percent of magnesium oxide, 11.3617 weight percent of titanium dioxide, and 0.5750 weight percent of calcium oxide were subjected to the same treatment as in Example 1, except the milling was conducted for two and one-half hours. The resulting dielectric material had a dielectric constant of 9.9±0.2 with a fired density of 3.55 g/cm$^3$.

EXAMPLE 3

This example relates to a process for producing a dielectric ceramic material having a dielectric constant of 9.9.

52.2677 weight percent of aluminumoxide, 34.0261 weight percent of magnesium oxide, 13.2427 weight percent of titanium dioxide, and 0.4635 weight percent of calcium titanate were processed in accordance with the procedure of Example 1 to produce a fired product having a dielectric constant of 9.9±0.2, and a fired density of 3.55 g/cm$^3$.

EXAMPLE 4

This example relates to a process for producing a dielectric ceramic material having a dielectric constant of 9.5.

54.4236 weight percent of aluminum oxide of aluminum oxide, 32.7551 weight percent of magnesium oxide, 10.3547 weight percent of titanium dioxide, and 0.4667 weight percent of calcium titanate were mixed together and treated in accordance with the procedure of Example 1, to produce a fired product which had a dielectric constant of 9.5±0.2, with a fired density of 3.52 g/cm³.

EXAMPLE 5

This example relates to a process for producing a dielectric ceramic material having a dielectric constant of 12.0.

45.1229 weight percent of magnesium oxide, 37.1761 weight percent of titanium dioxide, and 16.7011 weight percent of aluminum oxide were processed according to the procedure of Example 1, yielding a fired product having a dielectric constant of 12.0±0.2, and a fired density of 3.55 g/cm³.

EXAMPLE 6

This example relates to a process for producing a dielectric ceramic material having a dielectric constant of 13.0.

47.3036 weight percent of magnesium oxide, 43.1347 weight percent of titanium dioxide, and 9.5616 weight percent of aluminum oxide were processed according to the procedures of Example 1, yielding a fired product having a dielectric constant of 13.0±0.2, and a fired density of 3.55 g/cm³.

EXAMPLE 7

This example relates to a process for producing a dielectric ceramic material having a dielectric constant of 10.0.

43.2414 weight percent of aluminumoxide, 37.0152 weight percent of magnesium oxide, and 19.7407 weight percent of titanium dioxide were mixed together and otherwise processed in accordance with the procedures of Example 1, yielding a fired product having a dielectric constant of 10.0±0.2, and a fired density of 3.55 g/cm³.

EXAMPLE 8

This example relates to a process for producing a dielectric ceramic material having a dielectric constant of 12.6.

46.0726 weight percent of magnesium oxide, 40.3356 weight percent of titanium dioxide, and 13.5918 weight percent of aluminum oxide were processed according to the procedure of Example 1, yielding a fired product having a dielectric constant of 12.6±0.2, and a fired density of 3.55 g/cm³.

EXAMPLE 9

This example relates to a process for producing a dielectric ceramic material having a dielectric constant of 11.0.

38.7465 weight percent of magnesium oxide, 36.8333 weight percent of aluminum oxide, 23.9684 weight percent of titanium oxide, and 0.4518 weight percent of calcium titanate were mixed together in accordance with the procedures of Example 1, producing a fired product having a dielectric constant of 11.0±0.2, and a fired density of 3.55 g/cm³.

We claim:

1. A single phase dense sintered ceramic dielectric alloy of the formula:

$$Mg_xAl_yTi_zO_4$$

wherein $$x+y+z=3$$

$$x=1-2$$

$$y=0.1-1.9$$

$$z=0.1-0.9$$

having a dielectric constant of at least 8.5 and no more than 13.8 and a density of at least 98% of the theoretical density.

2. Alloy of claim 1, wherein said density is at least about 99% of the theoretical density.

3. Alloy of claim 1, wherein the alloy has a fired density of at least 3.49 g/cm³.

4. Alloy of claim 1, wherein said alloy has a fired density of 3.50 to 3.66 g/cm³.

5. Alloy of claim 1, wherein said alloy has a dielectric constant of 8.5 to 13.0.

6. Alloy of claim 1, wherein said alloy has a dielectric constant of 9.2 to 10.4.

7. A method of modifying magnesium aluminate to lower the firing temperature thereof by at least 150° C. while maintaining a single phase sintered ceramic material to produce a densified sintered magnesium aluminum titanate having a low dielectric constant which is suitable for use as a substrate in stacks of printed circuits, said method comprising adding from 10 to 90 volume percent of magnesium titanate to the magnesium aluminate prior to firing to sinter same.

8. Method of claim 7, wherein the firing is at a temperature of 1325° to 1450° C.

9. Method of claim 8, wherein said temperature is 1400° to 1450° C.

10. Method of claim 7, wherein the materials are fired in an oxygen atmosphere having a gas gauge pressure of 0.7 to 5 atmospheres.

11. A method of electrically insulating two spaced points, said method comprising interposing between said points an insulating single phase sintered ceramic alloy layer having a thickness of at least 0.005 inches, said alloy consisting essentially of the formula:

$$Mg_xAl_yTi_zO_4$$

wherein $$x+y+z=3$$

$$x=1-2$$

$$y=0.1-1.9$$

$$z=0.1-0.9$$

12. A single phase sintered substrate for an electrical circuit, said substrate consisting essentially an alloy of the formula:

$$Mg_xAl_yTi_zO_4$$

wherein $$x+y+z=3$$
$$x=1-2$$
$$y=0.1-1.9$$
$$z=0.1-0.9$$

having at least one surface thereof which contacts said electrical circuit finished to a surface profile of less than 4 microinches.

13. An electrical device having a single phase sintered ceramic insulator which has dielectric constant of about 8.5 to about 13.8, said ceramic insulator consisting essentially of an alloy of the formula:

$$Mg_xAl_yTi_zO_4$$

wherein $$x+y+z=3$$
$$x=1-2$$
$$y=0.1-1.9$$
$$z=0.1-0.9$$

said alloy having a density which is at least 98% of theoretical.

14. Device of claim 13, wherein said device is a circulator, a phase shifter for microwave and millimeter wave systems, a multilayer digital circuit, or a Farraday rotator.

* * * * *